United States Patent [19]

Shinbashi et al.

[11] Patent Number: 5,504,761
[45] Date of Patent: Apr. 2, 1996

[54] APPARATUS FOR DETECTING ERROR IN A COMMUNICATIONS LINE

[75] Inventors: Masahiro Shinbashi; Junichi Ishiwatari, both of Kawasaki, Japan

[73] Assignee: Fujitsu Limited, Kanagawa, Japan

[21] Appl. No.: 222,482

[22] Filed: Apr. 5, 1994

[30] Foreign Application Priority Data

Sep. 17, 1993 [JP] Japan .................................... 5-254838

[51] Int. Cl.⁶ ...................................................... G06F 11/00
[52] U.S. Cl. .......................................... 371/57.2; 371/20.1
[58] Field of Search ................................ 371/20.1, 20.2, 371/20.3, 20.5, 20.4, 56, 55, 57.1, 60, 57.2

[56] References Cited

U.S. PATENT DOCUMENTS

| | | | |
|---|---|---|---|
| 4,086,566 | 4/1978 | Lender | 340/146.1 AB |
| 4,535,451 | 8/1985 | Drupsteen | 370/99 |
| 4,581,741 | 4/1986 | Huffman et al. | 371/67.1 |
| 4,584,690 | 4/1986 | Cafiero et al. | 375/18 |
| 4,750,179 | 6/1988 | Davidow et al. | 371/57.1 |
| 5,185,736 | 2/1993 | Tyrrell et al. | 370/84 |
| 5,285,459 | 2/1994 | Okuyama et al. | 371/57.1 |

OTHER PUBLICATIONS

Eu, "An Evaluation of Error Performance Estimation Schenus for DSI Transmission Systems Carrying Live Traffic" IEEE Trans. on Comm. vol. 38, No. 3 Mar. 1990.

Modestino et al "Use of Coding to Combat Impulse Noise on Digital Subscriber Loops" IEEE Trans. on Comm. vol. 36, No. 5 May 1988.

*Primary Examiner*—Robert W. Beausoliel, Jr.
*Assistant Examiner*—Joseph E. Palys

[57] ABSTRACT

Error detection apparatus for a communications line includes an even/odd detection unit for detecting whether an even number of bipolar pulses or an odd number of bipolar pulses occur between a first pulse (violation pulse) interrupting an alternating pattern of bipolar pulses and a second pulse (violation pulse), and an output unit which determines that there is a line error in a target block defined by the first and second violation pulses when a detection result of the even/odd detection unit indicates an even number, wherein the first and second violation pulses occur in a code sequence in accordance with a predetermined coding scheme.

8 Claims, 6 Drawing Sheets

APPARATUS FOR DETECTING ERROR IN A COMMUNICATIONS LINE

BACKGROUND OF THE INVENTION

The present invention relates to an apparatus for detecting errors (hereinafter, simply referred to as line errors) in a communications line as accurately as possible and to improve the precision with which the quality of transmission is evaluated.

Communications networks have come to play an increasingly important role in social and economic activities. As there is now a wide demand for a broadband service, the reliability of a network has definitely become a factor of foremost importance. At present, an increasing number of dedicated lines carrying a DS3 signal (third-level signal in the digital hierarchy) are being provided to North American subscribers to the broadband service. Such a network is characterized by a direct interface with the subscriber, and so the quality of the line is especially important in the maintenance/operation of the network. Hence, it is required that the quality of the line be accurately evaluated.

FIG. 1 shows a location in the line carrying the DS3 signal, at which location the line quality is monitored. A DS1 signal is multiplexed by means of a multiplexing unit MUX and sent to an optical transmission line via a terminal office unit LTE. The quality of the line is monitored by means of the terminal office unit LTE.

As mentioned above, it is necessary for the carrier providing the service using the DS3 signal to monitor the quality of the line to which the subscribers are connected. A method for detecting errors in the code sequence produced in accordance with the B3ZS (Bipolar with 3 Zero Substitution) coding (a coding technique adopted for the DS3 signal) is proposed by Bellcore.

As shown in FIG. 2, according to the B3ZS coding, the code "00V" or "B0V" is substituted for a string of three zeros in ordinary AMI (Alternate Mark Inversion) bipolar signal bits is substituted for in accordance with a predetermined rule. Referring to FIG. 2, V indicates a violation pulse which interrupts the alternating pattern of a bipolar signal, B indicates the bipolar pulse, and + and − signify the polarity of a pulse. The predetermined rule requires that the substitution be performed such that an odd number of bipolar pulses B occur between one violation pulse $V_n$ and the next violation pulse $V_{n+1}$.

In the example shown in FIG. 2, the first string of three zeros "000" in the data sequence "01000110001" is converted into "00V" and the next string of three zeros "000" is converted into "B0V" so that an odd number of (in this case, three) bipolar pulses intervene between the violation pulses $V^+$ and $V^-$. The result of this is the code sequence "0B$^+$00V$^+$B$^-$B$^+$B$^-$0V$^-$B$^+$".

By monitoring such a code sequence at the receiving end of the DS3 signal, it is possible to monitor the quality of the line. That is, when the occurrence of a violation pulse V which is not produced in accordance with the above-mentioned rule is detected, it is considered that there is an error in the code transmitted over the line, and the error is detected.

As mentioned before, it is possible to detect a line error by monitoring code sequences of the DS3 signal encoded in accordance with the B3ZS coding. In the error detection method as proposed by Bellcore, the line error is detected by identifying the BPV (Bipolar Violation). In this method, violation pulses V other than those occurring in the sequences "00V̲" or "B0V̲", which sequences are obtained as a result of converting the strings of three zeros in the DS3 code sequence, are designated as the "BPV", that is, the line error. The quality of the line is evaluated by counting the occurrences of BPVs.

A line error detection apparatus faithfully implementing the above-mentioned definition has the circuit configuration as shown in FIG. 3. Referring to FIG. 3, a B/U converter 20 converts bipolar pulses B in the DS3 signal input from the line into unipolar pulses. A B3ZS decoder 21 decodes the B3ZS code sequence output from the B/U converter 20 and delivers the decoded result to a multiplexing unit 22. An extraction part 23 extracts violation pulses V included in the patterns "B<u>B0V</u>" or "B<u>00V</u>" from the B3ZS code sequence output from the B/U converter 20. A BPV pulse detection part 24 detects a line error by identifying the BPV, the BPV being the violation pulses other than the extracted violation pulses. The BPV is designated as the error pulse and the occurrences thereof are counted by means of a counter 4. The count provided by the counter 4 signifies the quality of the line.

Tables 1 and 2 below list exemplary patterns of errors in code sequences. It will be noted that the conventional line error detection circuit can detect only 40% of the total number of occurrences error.

In Tables 1 and 2, B indicates a positive bipolar pulse $B^+$, b indicates a negative bipolar pulse $B^-$, V indicates a positive violation pulse $V^+$, and v indicates a negative violation pulse $V^-$. The mark " ' " is attached to a bit where an error has occurred, and the mark "_" is attached to a bit where an error is detected. A sample data sequence of "1000000000100000100011" which is translated into "b00vB0Vb0vB00V00b00vBb" as a result of the B3ZS coding, is used in these table. In each row of Tables 1 and 2, it is assumed that an error has occurred in the bit position indicated by the mark " ' ", and that the original bit is transformed into the bit shown next to the mask " ' ". Table 1 shows cases where certain B, b, V and v pulses are transformed into a "0" pulse, or where a "0" pulse is transformed into a B, b, V or v pulse. Table 2 shows cases where a B pulse is transformed into a b pulse or vice versa, or where a V pulse is transformed into a v pulse or vice versa.

TABLE 1

| | (cases where the transformation B, b, V, v → 0 or 0 → B, b, V, v occurs) | | |
|---|---|---|---|
| Case No. | Original Pattern 1000000000100000100011 b00vB0Vb0vB00V00b00vBb | No. of Detected Errors | Note |
| 1 | b000B0V̲ | 1 | 0B0V |
| 2 | b00v00Bb0v | 0 | |
| 3-1 | b00vB̲V̲Vb0v | 1 | BV |
| 3-2 | b00vBbBb0v | 0 | |
| 4 | b00vB00b0v̲ | 1 | 0b0v |
| 5 | b00vB0V00bB00V | 0 | |
| 6-1 | b00vB0VbBbB00V | 0 | |
| 6-2 | b00vB0VbvvB00V | 1 | bv |
| 7 | b00vB0Vb00B00V | 0 | |
| 8 | b00vB0Vb0v000B00b00v | 0 | |
| 9-1 | b00vB0Vb0vBV̲0V | 1 | BV |
| 9-2 | b00vB0Vb0vBb0B00b00v | 0 | |
| 10-1 | b00vB0Vb0vB0VV00b00v | 0 | |
| 10-2 | b00vB0Vb0vB0bB00b00v | 0 | |
| 11 | b00vB0Vb0vB00000b00v | 0 | |
| 12-1 | b00vB0Vb0vB00VV0b00v | 0 | |
| 12-2 | b00vB0Vb0vB00Vb0v00v | 0 | |

TABLE 2

(cases where the transformation B ⇆ b or V ⇆ v occurs)

| Case No. | Original Pattern 10000000000100000100011 b00vB0Vb0vB00V00b00vBb | No. of Detected Errors | Note |
|---|---|---|---|
| 1  | b00BV0V                  | 1 | Bv |
| 2  | b00vv0Bb0v               | 0 |    |
| 3  | b00vB0bv0v               | 1 | bv |
| 4  | b00vB0VV0bB0V            | 0 |    |
| 5  | b00vB0Vb0BV00V           | 1 | BV |
| 6  | b00vB0Vb0vv00B00b00v     | 0 |    |
| 7  | b00vB0Vb0vB00b00v00v     | 0 |    |
| 8  | b00vB0Vb0vB00V00V00bBb   | 0 |    |
| 9  | b00vB0Vb0vB00V00b00BVb   | 1 | BV |
| 10 | b00vB0Vb0vB00V00b00vvv   | 0 |    |
| 11 | b00vB0Vb0vB00V00b00vBV   | 1 | BV |

Referring to Tables 1 and 2, it will be noted that in those cases where the number of detected errors is 0, the 1-bit line error occurring in the bit position indicated by the mark "‾" is not properly detected because the code sequence produced as a result of the error is seemingly normal.

Thus, it is inherently impossible to detect 100% of the errors by checking the code sequence. Below there are shown cases other than those listed in Tables 1 and 2 where a seemingly normal code sequence is produced as a result of errors occurring in two consecutive bits, with the result that the errors are not properly detected.

1  "V⁻B⁺B⁻B⁺B⁻B⁺0V⁺"
   → "V⁻B⁺0'0'B⁻B⁺0V⁺"
2  "V⁻00B⁺00B⁻B⁺0V⁺"
   → "V⁻000'000'B⁺0V⁺"

where "‾" indicates a bit where an error has occurred.

Thus, it is impossible, with the conventional definition, to detect an error including a string of zeros. Therefore, there is a need for developing an error detection technique adapted for detecting errors as accurately as possible except for those patterns that escape the detection, and for improving the accuracy in the line quality evaluation.

SUMMARY OF THE INVENTION

Accordingly, it is a general object of the present invention to provide a line error detection apparatus in which line errors are detected as accurately as possible so that the quality of the line can be evaluated accurately.

Another and more specific object of the present invention is to provide a line error detection apparatus comprising: even/odd detection means for detecting whether an even number of bipolar pulses or an odd number thereof occur between a first pulse (violation pulse) interrupting an alternating pattern of bipolar pulses and a second pulse (violation pulse); and outputting means for determining that there is a line error in a target block defined by the first and second violation pulses when a detection result generated by said even/odd detection means indicates an even number, the first and second violation pulses occurring in a code sequence in accordance with a predetermined coding scheme.

According to the line error detection apparatus of the present invention, it is possible to detect 100% of isolated errors occurring in non-consecutive blocks, the blocks being defined by violation pulses. Therefore, it is possible to perform a high-precision evaluation of the quality of the line used in the DS3 signal service provided to end users.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENT

Figure 1:
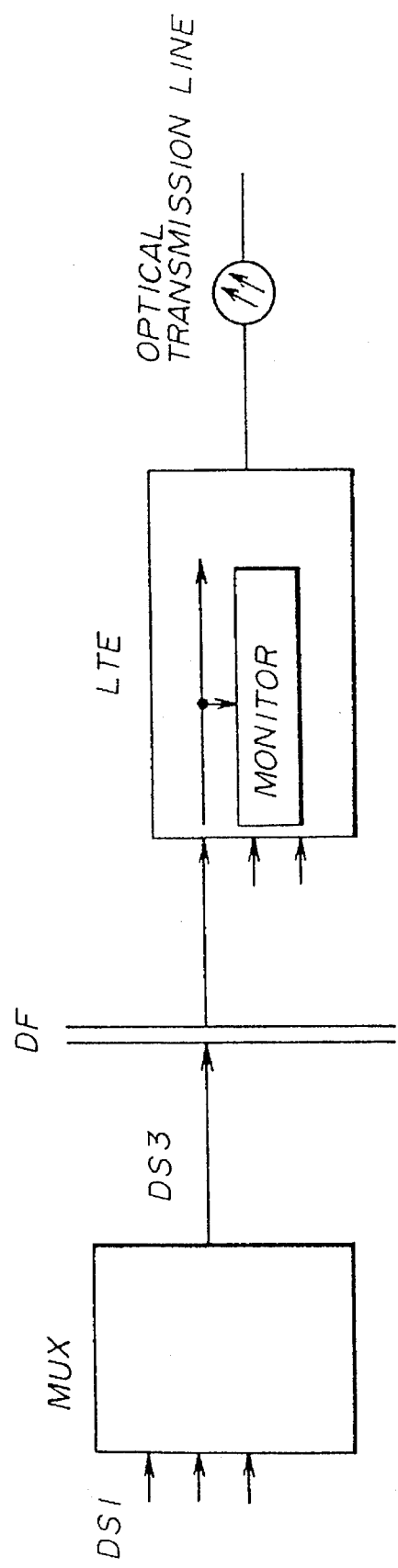
FIG. 1 is a diagram explaining the location at which the quality of a DS3 line is monitored.
Figure 2:
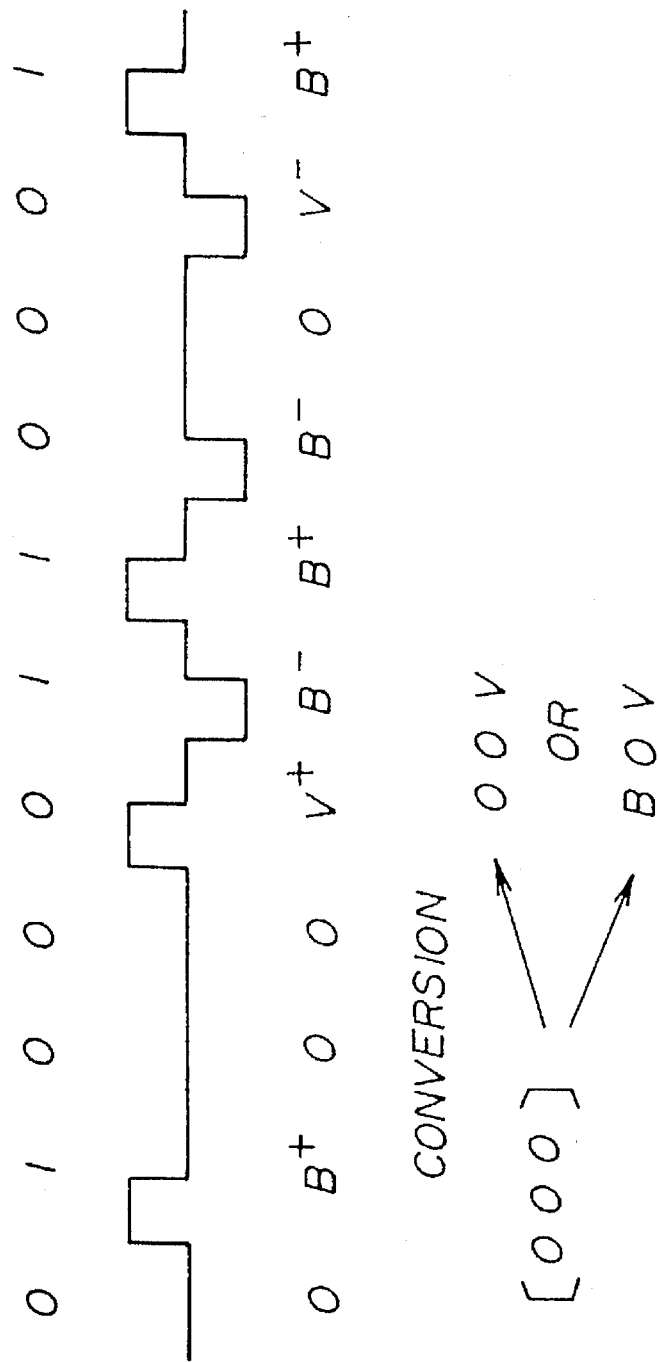
FIG. 2 shows an example of a B3ZS code carried in the DS3 line.
Figure 3:
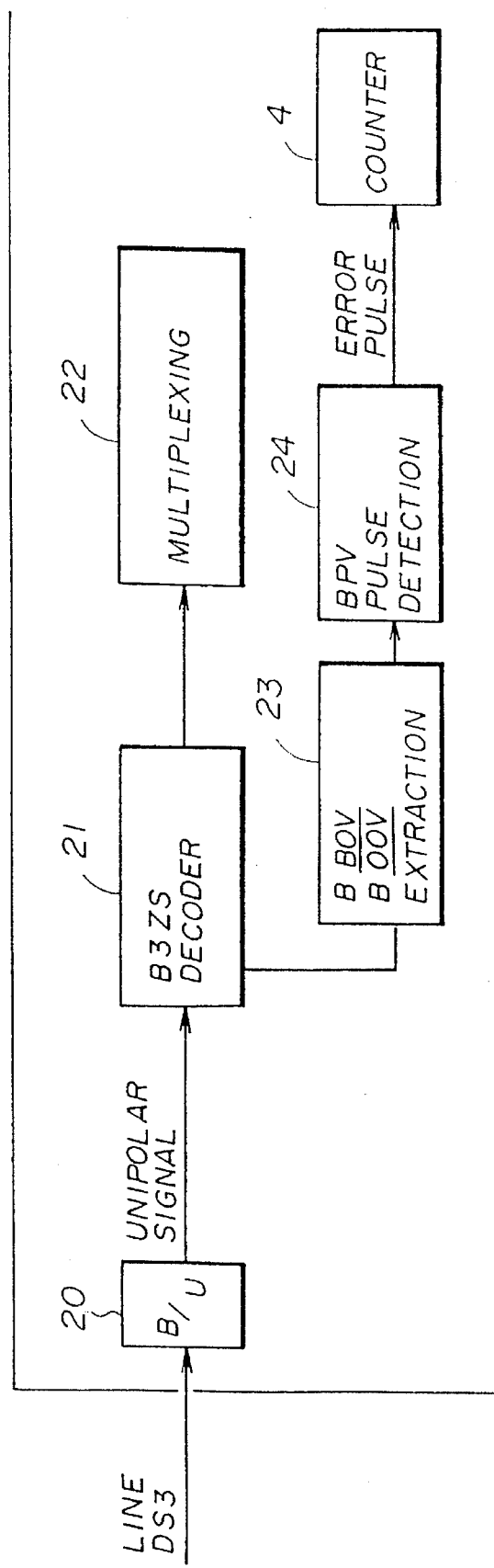
FIG. 3 is a block diagram showing a conventional error detection apparatus used in the DS3 line.
Figure 4:
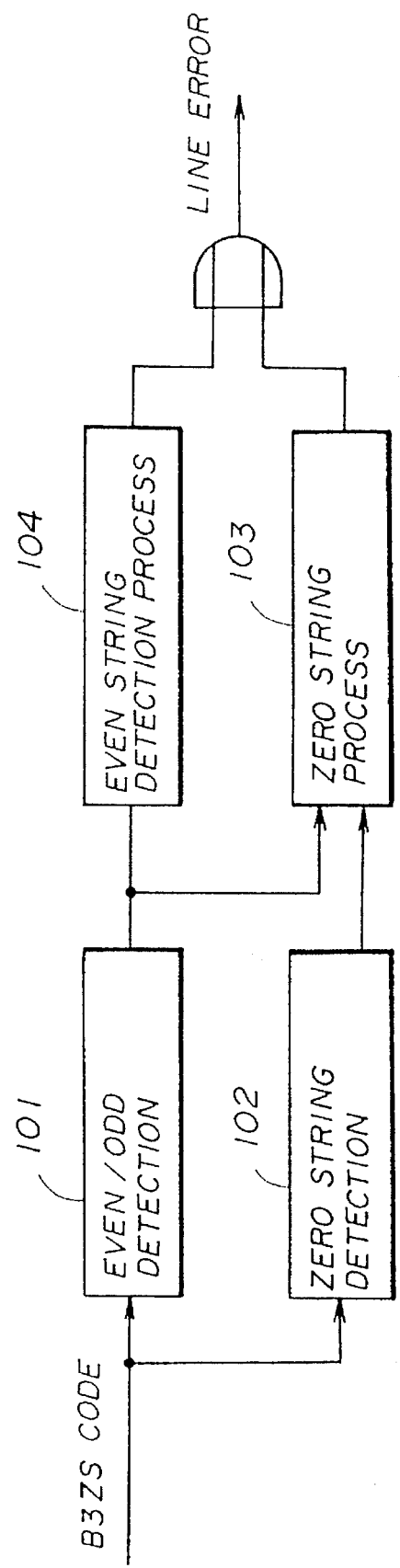
FIG. 4 is a block diagram showing the principle of the present invention.

FIG. 4 is a block diagram showing the principle of the present invention.

Referring to FIG. 4, the line error detection apparatus of the present invention includes an even/odd detection part 101 for detecting whether an even number of bipolar pulses B or an odd number thereof occur between the violation pulse $V_n$ and the next violation pulse $V_{n+1}$, which violation pulses are provided as a result of the B3ZS coding rule being applied to the input code sequence, wherein it is determined that there is a line error in the target block beginning with the violation pulse $V_n$ and ending with the violation pulse $V_{n+1}$ when the detection result indicates an even number.

The aforementioned line error detection apparatus may include a zero string detection part 102 for detecting a string of more than two zeros between the violation pulse $V_n$ and the next violation pulse $V_{n+1}$, wherein the detected string is counted as a line error.

The aforementioned line error detection apparatus may also include a zero string process part 103 for performing a process whereby, when the even/odd detection part 101 makes a determination that there is a line error in the block beginning with the violation pulse $V_n$ and ending with the violation pulse $V_{n+1}$ while at the same time the zero string detection part 102 detects a string of zeros in the same block, only one of the detection results is counted as a line error.

The aforementioned line error detection apparatus may also include an even string detection process part 104 for performing a process whereby, when the even/odd detection part 101 detects an even number of bipolar pulses in two consecutive blocks, that is, in the block between the violation pulses $V_n$ and $V_{n+1}$ and in the block between the violation pulses $V_{n+1}$ and $V_{n+2}$, only one of the detection results is counted as a line error.

According to the present invention, the accuracy of the detection of an isolated error is made certain by an operation in which, when it is found by means of the even/odd detection part 101 that an odd number of (including zero) bipolar pulses B intervene between the violation pulses $V_n$ and $V_{n+1}$, a determination is made that there is a line error.

While in the conventional definition of the line error does not take a string of more than two zeros into consideration, the zero string detection part 102 of the present invention ensures that a string of more than two zeros is counted as an error. When both the zero string detection part 102 and the even/odd detection part 101 yields a positive detection result, that is, when both of them make a determination that there is a line error, only one of these detection results is counted as a line error by a process performed by the zero string process part 103.

When a positive B pulse is transformed into a negative B pulse, or vice versa, in the block beginning with the violation pulse $V_n$ and ending with the violation pulse $_{n+1}$, this error is propagated to the next block beginning with the violation pulse $V_{n+1}$ and ending with the violation pulse $V_{n+2}$. In such a case, the even string detection part 104 ensures that one of the two occurrences of an even number of bipolar pulses in a block is discarded so that an excessive number of errors is not counted.

Figure 5:
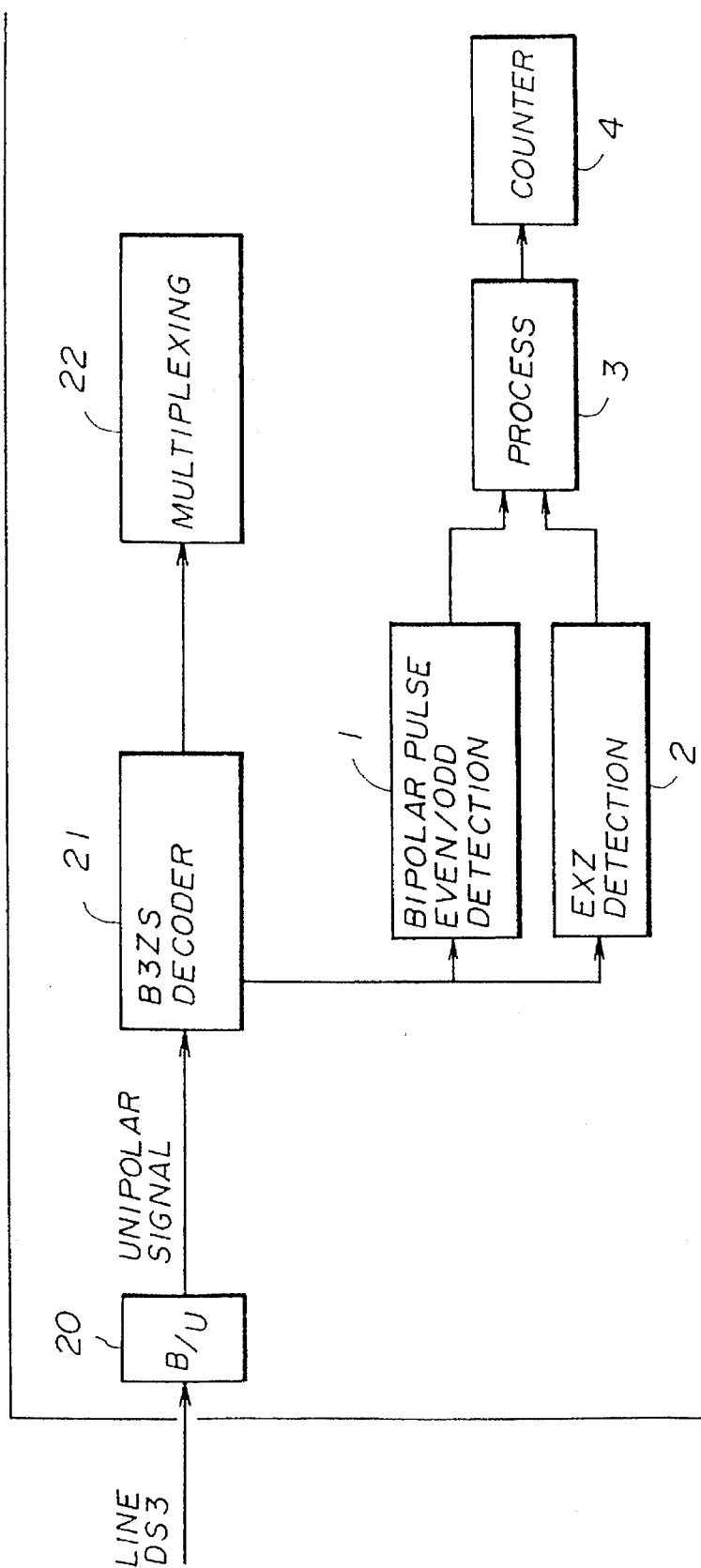
FIG. 5 is a block diagram showing a schematic configuration of a line error detection apparatus according to an embodiment of the present invention.
Figure 6:
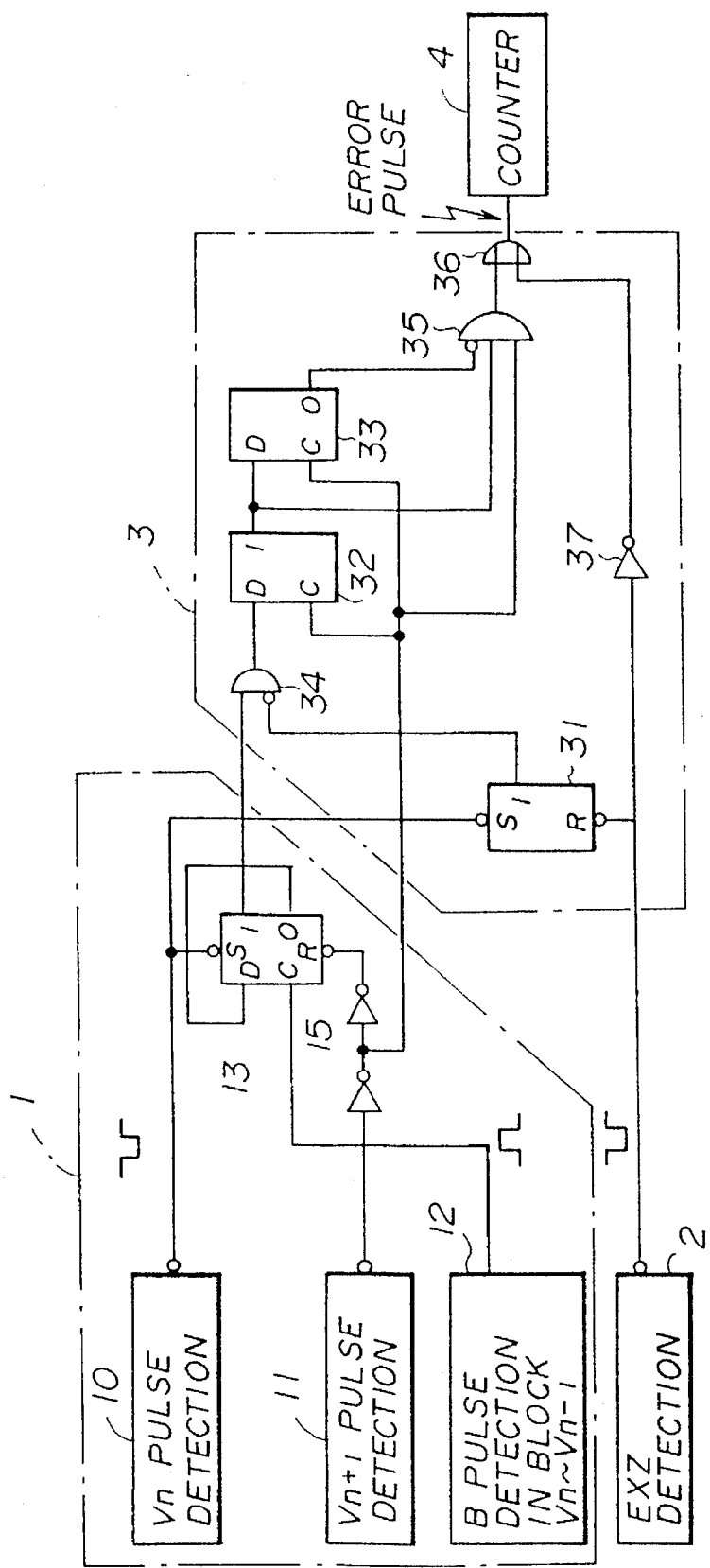
FIG. 6 is a diagram showing the detailed construction of an essential part of the line error detection apparatus according to the embodiment.

FIG. 5 is a block diagram showing the schematic configuration of a line error detection apparatus according to an embodiment of the present invention; and FIG. 6 is a diagram showing the detailed construction of an essential part of the apparatus according to the embodiment. It is assumed that the target signal in which an error is to be detected is the DS3 signal encoded in accordance with the B3ZS coding.

Referring to FIG. 5, the B/U converter 20, the B3ZS decoder 21 and the multiplexing unit 22 are the same as those described in the above prior art. The line error detection apparatus shown in FIG. 5 includes a bipolar pulse even/odd detection part 1 for counting the number of bipolar pulses ($B^+$or $B^-$) intervening between the violation pulse $V_n$ and the next violation pulse $V_{n+1}$ occurring in the input B3ZS code sequence as a result of a B3ZS coding scheme, and for detecting whether the number is an even number (including zero) or an odd number. When an even number of bipolar pulses B occur in the block, a determination that there is a double violation is made, and a pulse "1" indicating an error in the block is output from the bipolar pulse even/odd detection part 1.

The line error detection apparatus shown in FIG. 5 also includes an EXZ (Excessive Zeros) detection part 2 which is a circuit for detecting a string of more than two zeros between the violation pulse $V_n$ and the next violation pulse $V_{n+1}$ occurring in the input B3ZS code sequence as a result of the B3ZS coding, and for outputting a pulse "0" indicating a detection of excessive zeros when it is necessary.

The line error detection apparatus shown in FIG. 5 also includes a process part 3 for counting the number of line errors on the basis of the detection results yielded by the bipolar pulse even/odd detection part 1 and the EXZ detection part 2. When an even number of bipolar pulses B occur in the block beginning with the violation pulse $V_n$ and ending with the violation pulse $V_{n+1}$, or when a string of more than two zeros occur in the block beginning with the violation pulse $V_n$ and ending with the violation pulse $V_{n+1}$, it is determined that one error has occurred in that block. The process part 3 performs a process whereby, when the detection of an error by the bipolar pulse even/odd detection part 1 and the detection of an error by the EXZ detection part 2 coincide, an error detected in the block by the bipolar pulse even/odd detection part 1 is not counted. When an error (double violation) is detected by the bipolar pulse even/odd detection part 1 in two consecutive blocks, that is, both in the block beginning with the violation pulse $V_n$ and ending with the violation pulse $V_{n+1}$ and in the block beginning with the violation pulse $V_{n+1}$ and ending with the violation pulse $V_{n+2}$, only one of the errors is counted.

FIG. 6 shows the detailed configuration of the bipolar pulse even/odd detection part 1 and the process part 3. Referring to FIG. 6, the bipolar pulse even/odd detection part 1 comprises a $V_n$ pulse detection part (first violation pulse detection means) 10, a $V_{n+1}$ pulse detection part (second violation pulse detection means) 11, a bipolar pulse detection part 12 for detecting bipolar pulses in a block beginning with the violation pulse $V_n$ and ending with the violation pulse $V_{n+1}$, an SR flip-flop 13, and inverters 14 and 15. The SR flip-flop 13 receives a $V_n$ pulse detection signal at a set (S) input, receives a $V_{n+1}$ pulse detection signal at a rest (R) input, and receives a bipolar pulse detection signal at a clock (C) input. Whenever the bipolar pulse is detected, the output signal from the SR flip-flop is switched between "1" and "0". When an even number of bipolar pulses occur in the block $V_n$–$V_{n+1}$, the output signal from the SR flip-flop 13 is "1".

The process part 3 comprises an SR flip-flop 31, D flip-flops 32 and 33, AND gates 34 and 35, an OR gate 36, and an inverter 37. The output signal from the OR gate 36 is provided to the counter 4 as an error pulse.

The SR flip-flop 31 receives the $V_n$ pulse detection signal at a set (S) input and receives an EXZ detection signal at a reset (R) input. The output signal from the SR flip-flop 31 either enables or disables the AND gate 34. When excessive zeros in a block (EXZ) are detected by the EXZ detection part 2, the AND gate 34 masks a signal indicating the detection by the bipolar pulse even/odd detection part 1 of an even number of bipolar pulses in the same block, so that the signal from the bipolar pulse even/odd detection part 1 is not counted as indicating an occurrence of a line error.

The flip-flops 32 and 33 detect a string of double violations occurring in two consecutive blocks, whereupon one of the detected double violations is discarded. The AND gate 35 is enabled only when the bipolar pulse even/odd detection part 1 outputs the "0" pulse for the block $V_n$–$V_{n+1}$ while outputting the "1" pulse for the block $V_{n+1}$–$V_{n+2}$, so that a signal indicating a detection of a double violation is delivered as an error pulse to the counter 4 via the AND gate 35 and the OR gate 36.

A description will now be given of the operation of the apparatus according to the above described embodiment.

It is assumed that errors as listed in Tables 3 and 4 below occur in the code sequence. The symbols used in Tables 3 and 4 have the same respective meaning as those of Tables 1 and 2. The target data sequence to be subjected to the error detection is also assumed to have the same pattern as that of Tables 1 and 2. Like Table 1, Table 3 shows cases where certain B, b, V and v pulses are transformed into a "0" pulse, or where a "0" pulse is transformed into a B, b, V or v pulse. Like Table 2, Table 4 shows cases where a B pulse is transformed into a b pulse or vice versa, or where a V pulse is transformed into a v pulse or vice versa.

TABLE 3

(cases where the transformation B, b, V, v → 0 or 0 → B, b, V, v occurs)

| Case No. | Original Pattern 1000000000100000100011 b00vB0Vb0vB00V00b00vBb | No. of Detected Errors | | | Note |
|---|---|---|---|---|---|
| | | WV | EXZ | Total | |
| 1 | b00000<u>V</u> | 1 | 1 | 2 | 1) |
| 2 | b00v00Bb0v | 1 | 0 | 1 | |
| 3-1 | b00vBV<u>V</u>b0v | 1 | 0 | 1 | |
| 3-2 | b00vBbBb0<u>v</u> | 1 | 0 | 1 | |

TABLE 3-continued (cases where the transformation B, b, V, v → 0 or 0 → B, b, V, v occurs)

| Case No. | Original Pattern 1000000000100000100011 b00vB0Vb0vB00V00b00vBb | No. of Detected Errors WV | EXZ | Total | Note |
|---|---|---|---|---|---|
| 4 | b00vB00b0v | 1 | 0 | 1 | |
| 5 | b00vB0V00bB00V | 1 | 0 | 1 | |
| 6-1 | b00vB0VbBbB00V | 1 | 0 | 1 | |
| 6-2 | b00vB0VbvvB00V | 1 | 0 | 1 | |
| 7 | b00vB0Vb00B00V | 1 | 0 | 1 | |
| 8 | b00vB0Vb0v000B00b00 | 1 | 1 | 2 | |
| 9-1 | b00vB0Vb0vBV0V | 1 | 0 | 1 | |
| 9-2 | b00vB0Vb0vBb0B00b00v | 1 | 0 | 1 | |
| 10-1 | b00vB0Vb0vB0VV00b00v | 1 | 0 | 1 | |
| 10-2 | b00vB0Vb0vB0bB00b00v | 1 | 0 | 1 | |
| 11 | b00vB0Vb0vB00000b00v | 1 | 1 | 2 | |
| 12-1 | b00vB0Vb0vB00VV0b00v | 1 | 0 | 1 | |
| 12-2 | b00vB0Vb0vB00Vb0v00v | 1 | 0 | 1 | |

Note 1):
A even number of bipolar pulses occur, when the counting is started from the preceding violation pulse V.

TABLE 4

(cases where the transformation B ⇆ b or V ⇆ v occurs)

| Case No. | Original Pattern 1000000000100000100011 b00vB0Vb0vB00V00b00vBb | No. of Detected Errors WV | EXZ | Total | Note |
|---|---|---|---|---|---|
| 1 | b00BV0V | 2 | 0 | 2 | 1) |
| 2 | b00vv0Bb0v | 2 | 0 | 2 | |
| 3 | b00vB0bv0v | 2 | 0 | 2 | |
| 4 | b00vB0VV0bB00V | 2 | 0 | 2 | |
| 5 | b00vB0Vb0BV00V | 2 | 0 | 2 | |
| 6 | b00vB0Vb0vv00B00b00v | 2 | 0 | 2 | |
| 7 | b00vB0Vb0vB00b00v00v | 2 | 0 | 2 | |
| 8 | b00vB0Vb0vB00V00V00bBb | 2 | 0 | 2 | |
| 9 | b00vB0Vb0vB00V00b00BVb | 2 | 0 | 2 | |
| 10 | b00vB0Vb0vB00V00b00vvv | 2 | 0 | 2 | |
| 11 | b00vB0Vb0vB00V00b00vBV | 2 | 0 | 2 | 2) |

Note 1):
The preceding violation pulse V is taken into consideration.
Note 2):
The subsequent violation pulse V is taken into consideration.

Referring to the cases 1, 8 and 11 in Table 3, the total number of initially detected errors in each case is 2 despite the fact that a line error has occurred only in one bit, because both the bipolar pulse even/odd detection part 1 and the EXZ detection part 2 yield a detection pulse "1" with respect to the code sequence produced as a result of the single error. Hence, an accurate counting of errors is prevented. Accordingly, the process part 3 performs a process whereby the detection pulse "1" indicating the detection by the bipolar pulse even/odd detection part 1 of an even number of bipolar pulses in a block is masked by means of the AND gate 34 so that only the detection signal "1" indicating the detection by the EXZ detection part 2 of a string of zeros is output to the counter 4 as an error signal.

When a positive bipolar pulse is transformed into a negative bipolar pulse, or vice versa, as shown in Table 4, in the block beginning with the violation pulse $V_n$ and ending with the violation pulse $V_{n+1}$, this error (double violation) is propagated to the next block beginning with the violation pulse $V_{n+1}$ and ending with the violation pulse $V_{n+2}$. In such a case, the total number of the detected errors is 2 despite the fact that a line error has occurred only in one bit. Hence, an accurate counting of errors is prevented. This problem is overcome by allowing the process part 3 to perform a process whereby the D flip-flops 32 and 33 either enable or disable the AND gate 35 so that one of the double violations is discarded and thus the error count becomes 1.

Various configurations of the present invention other than those described above are possible. For example, the above described embodiment has a circuit configuration in which a signal indicating a detection by the bipolar pulse even/odd detection part 1 of the occurrence of an even number of bipolar pulses in a block and a signal indicating a detection by the EXZ detection part 2 of an excessive number of zeros coincide, the signal from the bipolar pulse even/odd detection part 1 being masked. Instead, a circuit configuration in which the signal from the EXZ detection part 2 is masked may be adopted.

The present invention is not limited to the above described embodiments, and variations and modifications may be made without departing from the scope of the present invention.

What is claimed is:

1. A line error detection apparatus comprising:

even/odd detection means for detecting whether an even number of bipolar pulses or an odd number thereof occur between a first pulse (violation pulse) interrupting an alternating pattern of bipolar pulses and a second pulse (violation pulse); and outputting means for determining that there is a line error in a target block defined by the first and second violation pulses when a detection result generated by said even/odd detection means indicates an even number, said first and second violation pulses occurring in a code sequence in accordance with a predetermined coding scheme.

2. The line error detection apparatus as claimed in claim 1, wherein said predetermined coding scheme is the B3ZS coding scheme.

3. The line error detection apparatus as claimed in claim 1, further comprising zero string detection means for detecting a string of more than two zeros between said first violation pulse and said second violation pulse, wherein such an occurrence of a string of more than two zeros is counted as a line error.

4. The line error detection apparatus as claimed in claim 3, further comprising zero string process means for counting, when said even/odd detection means makes a determination that there is a line error in a block beginning with said first violation pulse and ending with said second violation pulse and, at the same time, said zero string detection means detects a string of more than two zeros in the same block, only one of the detection results as a line error.

5. The line error detection apparatus as claimed in claim 4, wherein said zero string process means comprises:

an SR flip-flop which receives a first detection signal indicating a detection of said first pulse (violation pulse) at a set input thereof and receives a second detection signal from said zero string detection means at a reset input thereof; and a gate circuit for masking a signal output from said even/odd detection means by means of a signal output from said SR flip-flop.

6. The line error detection apparatus as claimed in claim 1, further comprising an even string detection process means for counting, when said even/odd detection means detects an even number of bipolar pulses in two consecutive blocks, that is, both in that block beginning with said first violation pulse and ending with said second violation pulse and in a block beginning with a third violation pulse and ending with a fourth violation pulse, only one of the detection results as a line error.

7. The line error detection apparatus as claimed in claim 6, wherein said even string detection process means comprises:

two flip-flops connected in a cascade manner for receiving an output of said even/odd detection means; and a gate circuit which is either enabled or disabled by an output from said flip-flops so as to either allow or prevent a detection signal indicating a detection of an error by said even/odd detection means to pass through the gate circuit.

8. The line error detection apparatus as claimed in claim 1, wherein said even/odd detection means comprises:

a first violation pulse detection means for detecting the first violation pulse;

a second violation pulse detection means for detecting the second violation pulse;

a bipolar pulse detection means for detecting bipolar pulses occurring between said first and second violation pulses; and an SR flip-flop which receives a detection signal from said first violation pulse detection means at a set input, receives a detection signal from said second violation pulse detection means at a reset input, receives a detection signal from said bipolar pulse detection means at a clock input, and receives a signal obtained by inverting a signal output from said SR flip-flop itself at a data input.

* * * * *